(12) United States Patent
Liu

(10) Patent No.: US 7,576,425 B2
(45) Date of Patent: Aug. 18, 2009

(54) CONDUCTING LAYER IN CHIP PACKAGE MODULE

(75) Inventor: Chien-Hung Liu, Taoyuan Hsien (TW)

(73) Assignee: Xintec, Inc., Taoyuan Hsien (TW)

( * ) Notice: Subject to any disclaimer, the term of this patent is extended or adjusted under 35 U.S.C. 154(b) by 0 days.

(21) Appl. No.: 11/657,734

(22) Filed: Jan. 25, 2007

(65) Prior Publication Data

US 2008/0182355 A1 Jul. 31, 2008

(51) Int. Cl.
*H01L 23/12* (2006.01)
(52) U.S. Cl. .................... 257/704; 438/116
(58) Field of Classification Search ............ 257/704
See application file for complete search history.

(56) References Cited

U.S. PATENT DOCUMENTS

| | | | |
|---|---|---|---|
| 6,531,328 B1 * | 3/2003 | Chen | ............ 438/26 |
| 6,856,357 B1 | 2/2005 | Stevenson | |
| 6,894,358 B2 | 5/2005 | Leib et al. | |
| 6,911,392 B2 | 6/2005 | Bieck et al. | |
| 7,071,521 B2 | 7/2006 | Leib et al. | |
| 7,160,478 B2 | 1/2007 | Leib et al. | |
| 7,285,434 B2 * | 10/2007 | Yee et al. | ............ 438/26 |
| 7,285,834 B2 | 10/2007 | Leib et al. | |
| 2004/0222433 A1 * | 11/2004 | Mazzochette et al. | ......... 257/99 |

FOREIGN PATENT DOCUMENTS

| | | |
|---|---|---|
| JP | 06-113214 | 4/1994 |
| JP | 10-335337 | 12/1998 |
| JP | 2001-351997 | 12/2001 |
| WO | 2005/004195 | 1/2005 |

* cited by examiner

*Primary Examiner*—Thao X Le
*Assistant Examiner*—Kimberly Trice
(74) *Attorney, Agent, or Firm*—Liu & Liu

(57) ABSTRACT

A conducting layer in a chip package module includes one or a plurality of through hole penetrating the top of a base being disposed at the bottom of an insulating layer in the chip package module, and inner wall of the through hole being applied with insulation material so that the conductive layer subsequently constructed to the peripheral of the insulation layer may pass the through hole to extend to where above the base before construction of a masking layer and multiple circuit pins to complete construction of the conducting layer that is totally enveloped so to prevent easy oxidization at the conducting layer and improve stability of the chip package to avoid breaking up due to external force applied.

19 Claims, 5 Drawing Sheets

CONDUCTING LAYER IN CHIP PACKAGE MODULE

BACKGROUND OF THE INVENTION

1. Field of the Invention

The present invention is related to a chip package module, and more particularly to an improved conducting layer in the chip package module by providing a structure of the conducting layer that is totally enveloped thus to prevent oxidization and assure of stability of the chip package without being broken up due to interference from external force.

2. Description of Prior Art

As electronic products are demanded lighter and smaller, development of assembly and configuration technologies for electronic devices also heads for getting lighter, thinner, shorter, and smaller. Single chip or multi-chip devices generally available in the market must be constructed into integrated chip package modules through packaging process before they are capable of transmitting I/O (input/output) signals, dissipating heat, and protecting the photo-sensitive chip.

Taking an image sensor as illustrated in FIG. 1 of the accompanying drawings for example, the image sensor justified as one of the typical chip package device modules includes multiple photo-sensitizing chips 11, circuitry layout and a casing; wherein, all photo-sensitizing chips 11 are arranged on a base 12 inside the casing, and the base 12 is provided with external connections 111 for those photo-sensitizing chips 11.

An isolating layer 151, a substrate 13, an insulation layer 14, a conducting layer 15, a outmost soldered masking layer 16, and multiple circuit pins 17 are respectively constructed in sequence below the base 12. In the entire circuit configuration, each pin 17 penetrates through the masking layer 16 to contact the conducting layer 15, where electric connection between the base 12 and the pin 17 is completed when the pin 17 bypasses the insulating layer 14 and the substrate 13 through the conducting layer 15. The conducting layer 15 is insulated from the sidewall of the base 12 by the isolating layer 151. A transparent lid 18 is disposed over and separated from those photo-sensitizing chips 11 by means of a weir 19 to form a cavity 20 between the transparent lid 18 and those photo-sensitizing chips 11.

As illustrated in FIG. 2, a manufacturing process for the chip package module of the prior art involves a process mode featuring arrangement of multiple chip package modules on the same substrate 13; and then units of chip package modules completed with the packaging process are cut one by one to avail multiple single units of integral chip package module. Given with the existing field of technology, a groove A as illustrated in FIG. 3 must be first provided among the chip package module units before the construction of the insulation layer by providing the insulation layer, the conducting layer, and the masking layer on the chip package module units; and finally, the transparent lid 18 is cut off along the groove A to separate each individual unit of the chip package module.

However, in the design of the conducting layer and the resulted expose of the conducting layer at where it is cut off during the manufacturing process of the prior art as illustrated in FIG. 1, the conducting layer is vulnerable to oxidization and thus corroded. Besides, the contact between the external connection 111 and the conducting layer 15 created by using the manufacturing process of the prior art is related to a fashion of T contact as illustrated in FIG. 1. T contact is less stable and tends to break off, and crack can easily develop at the T contact when subject to interference by external force.

BRIEF SUMMARY OF THE INVENTION

The primary purpose of the present invention is to provide a conducting layer in a chip package module and manufacturing method thereof for solving the problem of easy oxidization at the conducting layer and improving stability of the chip package to prevent breaking up the conducting layer due to external force applied. To achieve the purpose, one or a plurality of through hole penetrating the top of a base is disposed at the bottom of an insulating layer in the chip package module, and the inner wall of the through hole is applied with insulation material so that the conductive layer subsequently constructed to the peripheral of the insulation layer may pass the through hole to extend to where above the base before construction of a masking layer and multiple circuit pins to complete the construction of the conducting layer that is totally enveloped thus to prevent oxidization and assure of stability of the chip package without being broken up due to interference from external force.

DETAILED DESCRIPTION OF THE INVENTION

Figure 1:
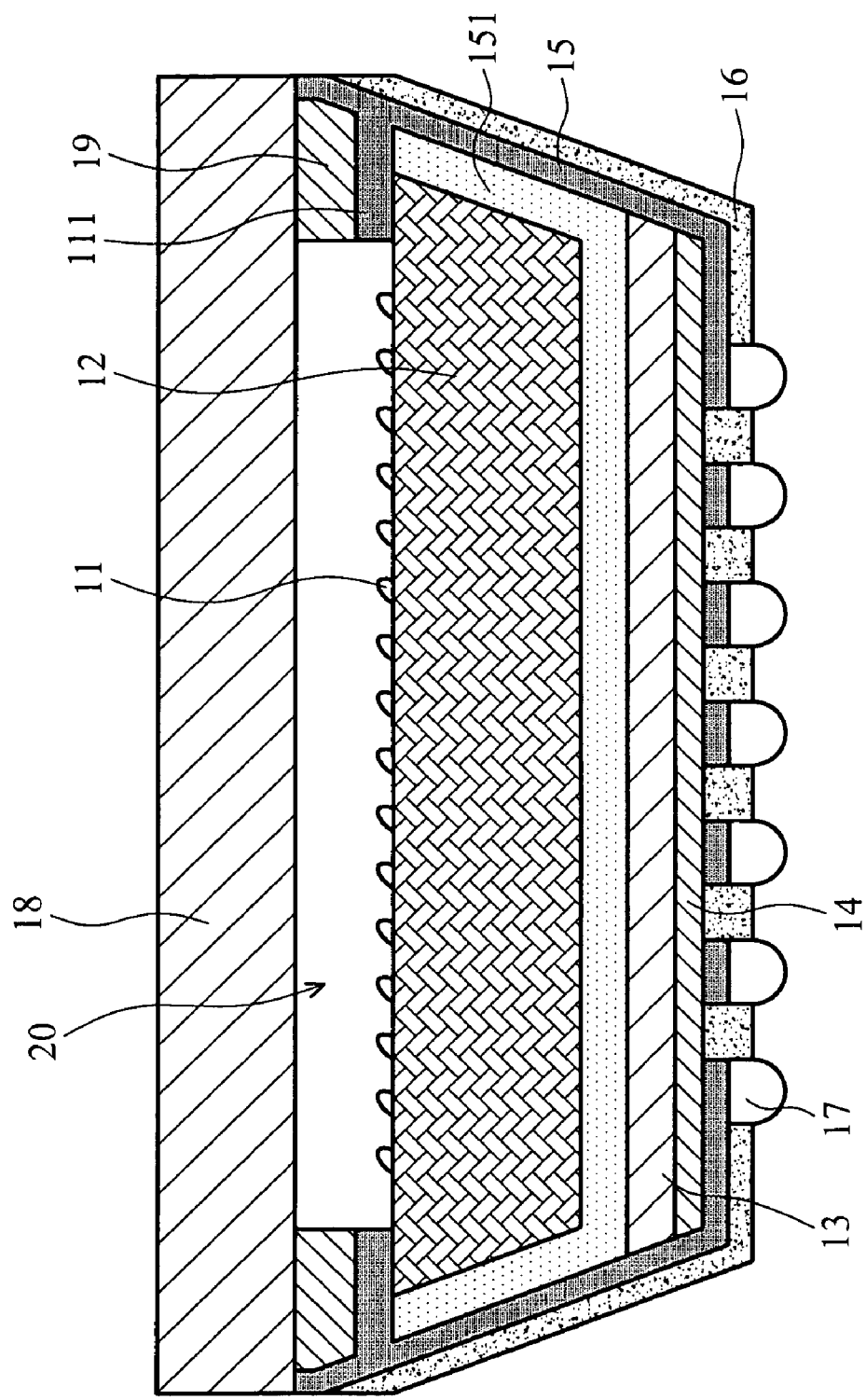
FIG. 1 is a sectional view of a construction of a chip package module adapted in an image sensor of the prior art.
Figure 2:
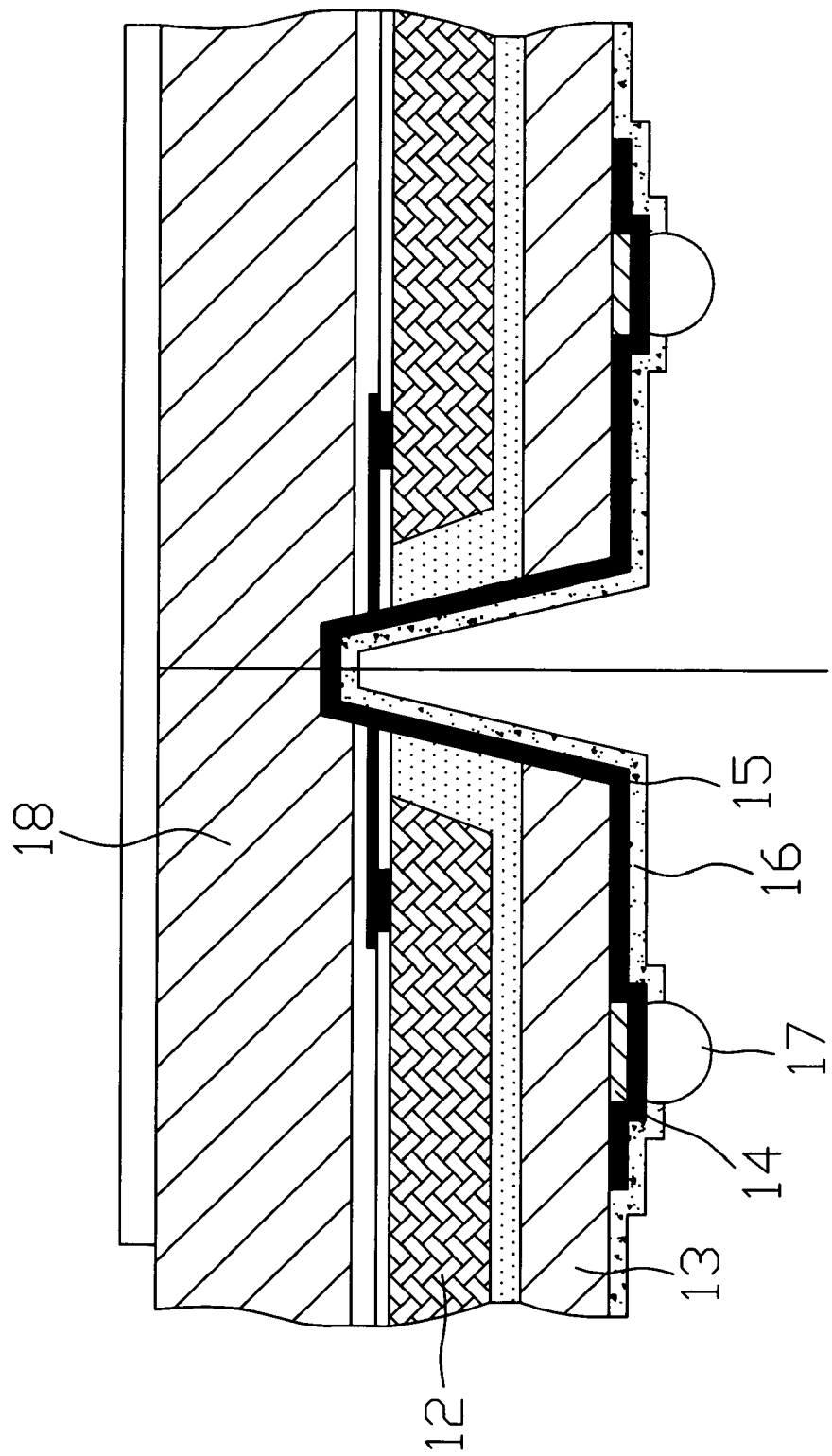
FIG. 2 is a sectional view showing the chip package module of the image sensor of the prior art in process before the cutting.
Figure 3:
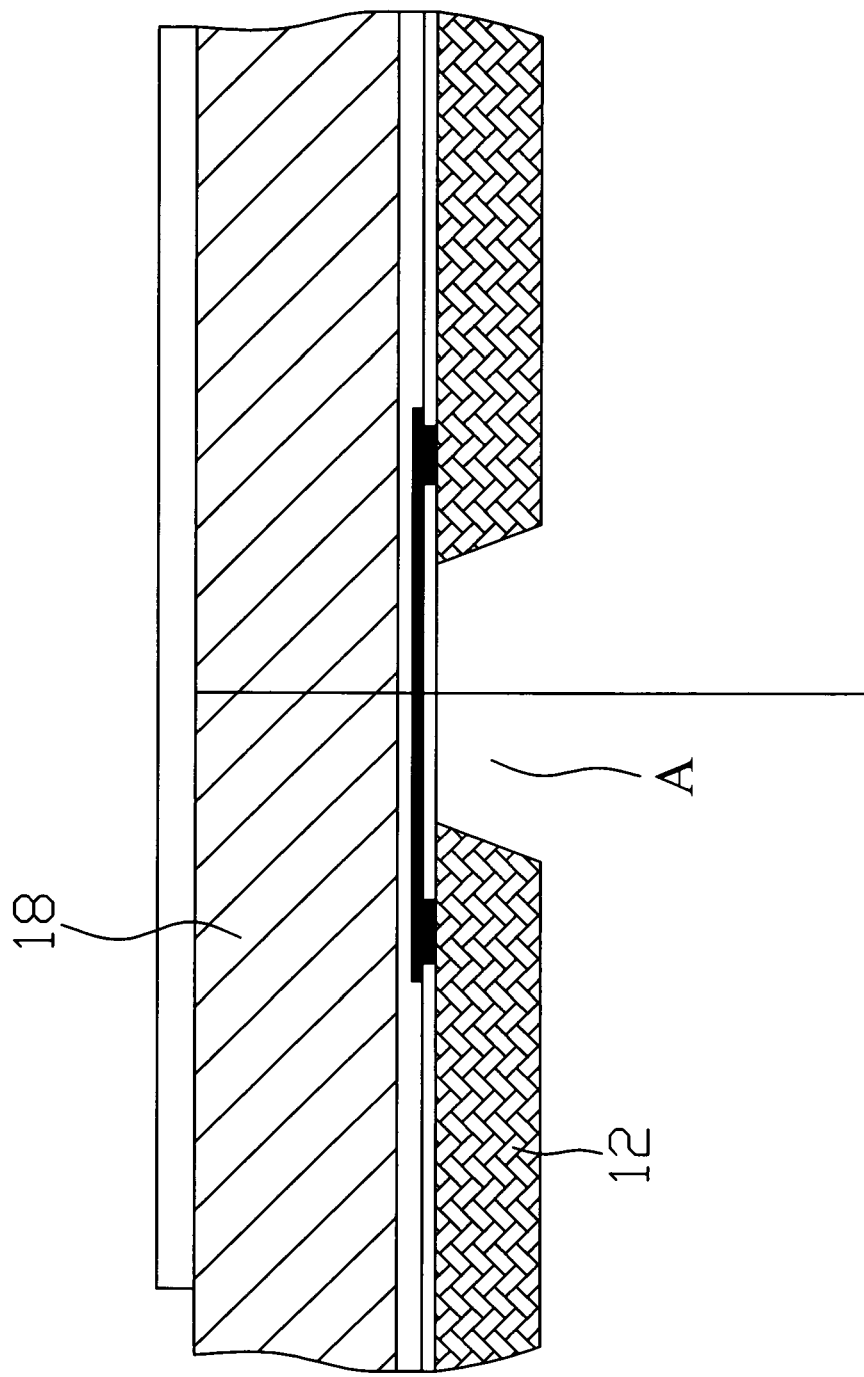
FIG. 3 is a sectional view of a semi-product of the chip package module of the image sensor of the prior art before the construction of an insulation layer.
Figure 4:
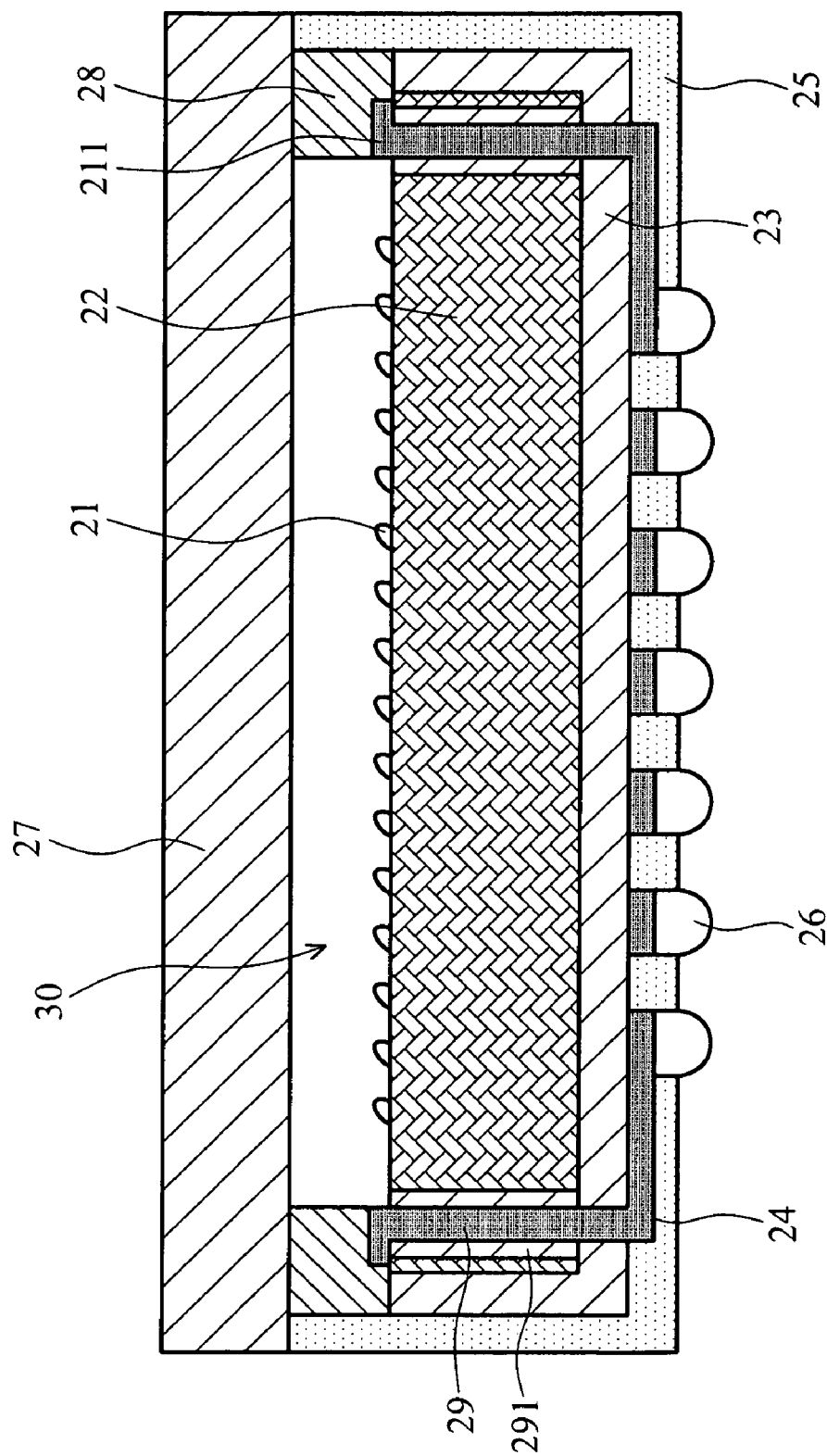
FIG. 4 is a sectional view showing a chip package module of a preferred embodiment of the present invention.

The present invention essentially provides to solve problems of being vulnerable to corrosion of a conductive layer due to oxidization and instable construction of a chip package module of the prior art. Referring to FIG. 4 for a sectional view of a chip package module construction of a preferred embodiment of present invention, the chip package module applied in the present invention also contains multiple photo-sensitizing devices 21, a circuitry configuration, and a casing as found in the prior art. Wherein, all the photo-sensitizing devices 21 are arranged on a base 22 inside the casing. The base 22 is related to silicon and disposed multiple external connections 211 for those photo-sensitizing devices 21.

An insulation layer 23, a conducting layer 24, the outmost soldered masking layer 25, and circuit pins 26 are disposed in sequence below the base 22. In the entire circuitry configuration, each circuit pin 26 passes through the masking layer 25 to contact the conducting layer 24 to constitute electric connection between the photo-sensitizing devices 21 and the circuit pin 26 through the conducting layer 24. A transparent lid 27 is disposed over and separated from those photo-sensitizing devices 21 with a spacer 28 to form a cavity 30 between the transparent lid 27 and those photo-sensitizing devices 21.

One or a plurality through hole 29 penetrating to the top of the base 22 is disposed on the bottom of the insulation layer 23 of the entire chip package module. The through hole 29 is disposed at where closer to the external connection 211 and the inner wall of the through hole 29 is applied with an insulation material 291 so that the conducting layer 24 constructed externally to the insulation layer 23 passes the through hole 29 to extend to where above the base 22 before the subsequently constructed masking layer 25 and those circuit pins 26 to fully screen the conducting layer 24 disposed at the bottom of the chip package module; meanwhile, the conducting layer 24 passes through the insulation layer 23 and the base 22 to achieve electric connection between the base and those circuit pins 26.

Accordingly, a construction of the conducting layer 24 being fully enveloped of the present invention not only solves the problem of having the conducting layer exposed to attract easy oxidization as found with the prior art but also provides a most stable construction for the contact between the conducting layer 24 and external connections 211 without breaking up easily by external force applied since the conducting layer 24 extends upwardly through the base of the chip package module to be enveloped in the constructions of the insulation layer 23 and the base 22 while the contact fashion between the conducting layer 24 and those external connections 211 relates to a plane instead of T-contact.

Figure 5:
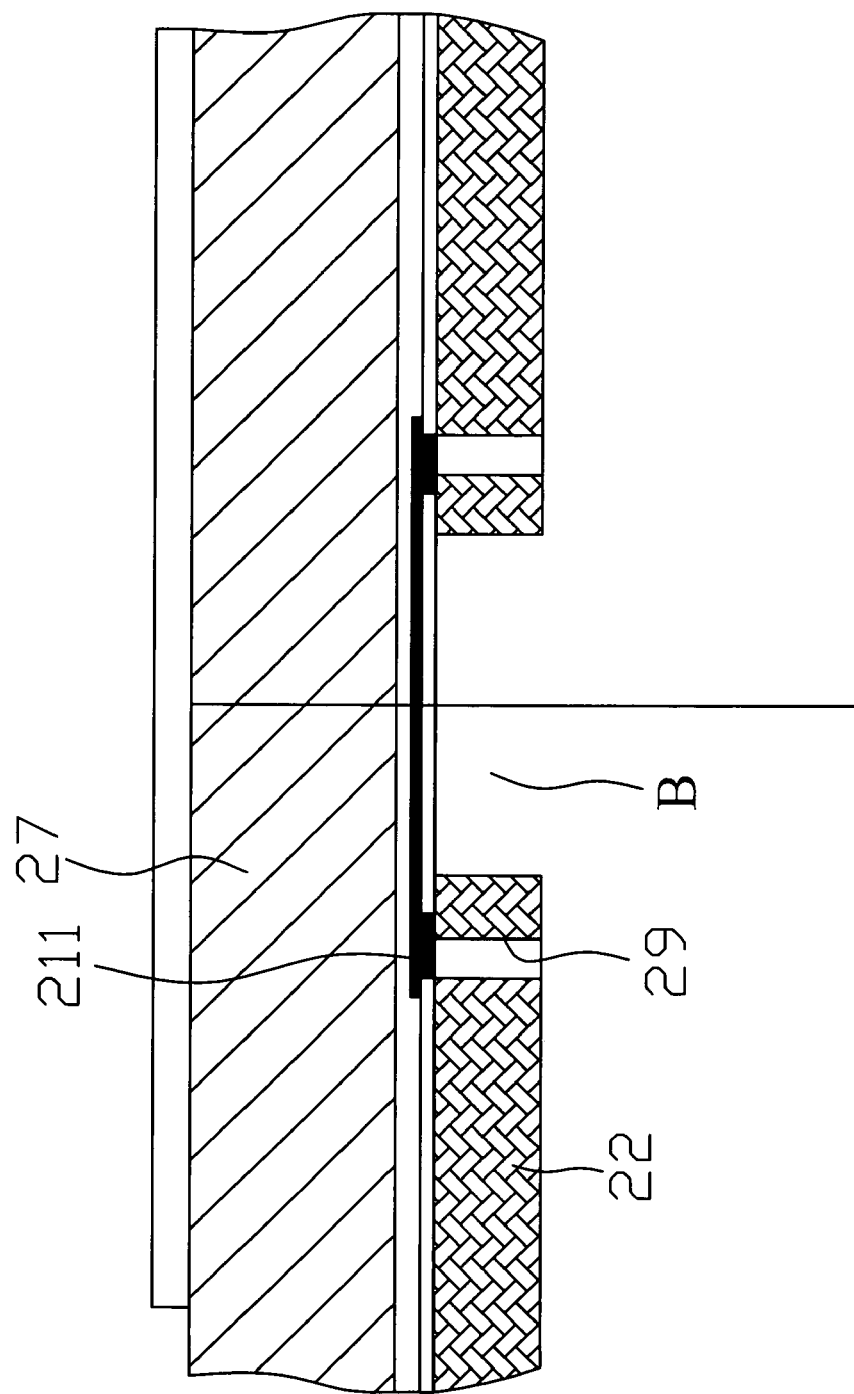
FIG. 5 is a sectional view showing the chip package module of the image sensor of the prior art in process before the cutting.

In practice, the process mode of having multiple chip package modules arranged on the same wafer is adopted for the chip package module of the present invention. The manufacturing process method of the entire chip package module of the present invention includes the following steps:

a. Multiple photo-sensitizing devices 21 are constructed on the base 22 and the transparent lid 27 separated with a spacer is disposed over those photo-sensitizing devices 21 as illustrated in FIG. 5;

b. The base is etched to form a first groove B to isolate each packaging unit of the chip package module; one of a plurality of through holes 29 penetrating through the top of the base 22 is disposed at where appropriately on the base; the through hole 29 is disposed at where closer to the external connection 211; the depth of the first groove B is preferred such that it penetrates into the transparent lid 27 and the first groove B is preferred to stand at an right angle to the base 22 so that the chip package module unit is made in a construction with its appearance roughly indicating a rectangular as illustrated in FIG. 4;

c. The insulation layer 23 is constructed to the outer perimeter of the wafer to such that the first groove B is filled up, and the insulation material 291 is applied on the inner wall of the through hole 29;

d. The conducting layer 24 is provided externally to the insulation layer 23, so that the conducting layer 24 passes the through hole 29 to extend to the top of the base 22 and further connect to the external connection 211;

e. The masking layer 25 is soldered to the outer perimeter of the conducting layer 24 and allow the raw material of the masking layer to impregnate in the first groove B;

f. The circuit pins 26 are constructed; and g. Finally, cut off the substrate along the first groove B to separate each unit of chip package module one by one.

Accordingly, the prevent invention by providing an improved structure of a conducting layer in a chip package module and a manufacturing process method thereof not only solves the problem of a conducting layer in the prior art that is vulnerable to get corroded due to oxidization, but also assures of a stable construction of the chip packaging by avoiding T contract to prevent breaking up due to external force applied.

The prevent invention provides an improved structure of a conducting layer in a chip package module, and the application for a utility patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

I claim:

1. A chip package module comprising:
   a base having at least a chip;
   a lid disposed over the chip;
   a spacer separating the base from the lid;
   a through hole penetrating through the base under the spacer;
   a first insulation layer within the through hole;
   a second insulation layer covering the base; and
   a conductive layer within the through hole and completely surrounded by the first insulation layer within the through hole, the conductive layer extending under the second insulation layer.

2. The chip package module of claim 1 further comprising:
   a solder masking layer under the lid, covering the second insulation layer and the conductive layer, wherein the conductive layer is configured to be free from being exposed to be oxidized.

3. The chip package module of claim 1 further comprising:
   a connection over the through hole, being electrically coupled with the conductive layer within the through hole.

4. The chip package module of claim 3 further comprising:
   a plurality of pins through the solder masking layer, wherein the conductive layer is electrically coupled with the connection and the pins.

5. The chip package module of claim 4, wherein a side edge and a bottom surface of the base have a substantially right angle and the conductive layer extends along the substantially right angle.

6. The chip package module of claim 5, wherein the second insulation layer is adjacent to the side edge of the base, separating the base from the conductive layer.

7. The chip package module of claim 6, wherein the second insulation layer is disposed under the base and along a side edge of the base.

8. The chip package module of claim 6, wherein the spacer is coupled with the solder masking layer.

9. The chip package module of claim 8, wherein the spacer is coupled with the first and the second insulation layer disposed between the conductive layer and the solder masking layer.

10. The chip package module of claim 1, wherein the lid is transparent.

11. The chip package module of claim 1, wherein the base comprises silicon.

12. The chip package module of claim 1, wherein the depth of the entire through hole is substantially equal to the thickness of the base neighboring the through hole.

13. The chip package module of claim 12, wherein the first insulation layer does not extend from the through hole to cover the base outside the through hole.

14. The chip package module of claim 1, wherein the first insulation layer does not extend from the through hole to cover the base outside the through hole.

15. A chip package module comprising:

a solder masking layer;

a plurality of pins through the solder masking layer;

a base with at least a chip over the solder masking layer, the silicon base comprising a hole therein and having a side edge and a bottom surface having a substantially right angle;

a conductive layer, passing through the hole, the conductive layer being electrically coupled with the chip and the pins, and the conductive layer extending along the substantially right angle;

a first insulation layer within the hole and separating the base from the conductive layer, wherein the conductive layer is completely surrounded by the first insulation layer in the hole;

a second insulation layer, disposed between the conductive layer and the solder masking layer, and covering the base;

a transparent lid disposed over the chip, wherein the transparent lid and the solder masking layer seal the conductive layer, such that the conductive layer is free from being exposed; and a spacer separating the base front the transparent lid, wherein the spacer is coupled with the first and the second insulation layer.

16. The chip package module of claim 15, wherein the depth of the entire through hole is substantially equal to the thickness of the base neighboring the through hole.

17. The chip package module of claim 16, wherein the first insulation layer does not extend from the through hole to cover the base outside the through hole.

18. The chip package module of claim 17, wherein the base is a silicon base.

19. The chip package module of claim 15, wherein the first insulation layer does not extend from the through hole to cover the base outside the through hole.

* * * * *